United States Patent
Badets (10) Patent No.: US 10,873,293 B2
(45) Date of Patent: Dec. 22, 2020

(54) INJECTION-LOCKED OSCILLATOR WITH VARIABLE LOAD IMPEDANCE

(71) Applicant: COMMISSARIAT A L'ENERGIE ATOMIQUE ET AUX ENERGIES ALTERNATIVES, Paris (FR)

(72) Inventor: Franck Badets, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/708,696

(22) Filed: Dec. 10, 2019

(65) Prior Publication Data

US 2020/0186087 A1    Jun. 11, 2020

(30) Foreign Application Priority Data

Dec. 11, 2018 (FR) ...................................... 18 72714

(51) Int. Cl.
*H03K 3/0231* (2006.01)
*H03K 3/03* (2006.01)
(Continued)

(52) U.S. Cl.
CPC .......... *H03B 19/14* (2013.01); *H03B 5/1265* (2013.01); *H03K 3/0231* (2013.01);
(Continued)

(58) Field of Classification Search
CPC .... H03B 19/14; H03B 5/1265; H03B 5/1268; H03B 2200/0074; H03K 3/0231;
(Continued)

(56) References Cited

U.S. PATENT DOCUMENTS 6,317,008 B1    11/2001  Gabara
9,257,939 B1 *   2/2016  Zhang .................. H03B 5/1212
(Continued)

FOREIGN PATENT DOCUMENTS

EP    3 312 568 A1    4/2018

OTHER PUBLICATIONS

French Preliminary Search Report dated Oct. 24, 2019 French Application 18 72714 filed Dec. 11, 2018 (with English Translation of Categories of Cited Documents), 2 pages.

*Primary Examiner* — Levi Gannon
(74) *Attorney, Agent, or Firm* — Oblon, McClelland, Maier & Neustadt, L.L.P.

(57) ABSTRACT

Injection-locked oscillator comprising:
  a control input receiving a control signal, the value of the natural frequency of the oscillator being a function of the amplitude of the control signal;
  a synchronisation input receiving a periodic synchronisation signal, the oscillator outputting an output signal with a frequency equal to the frequency of the synchronisation signal, and such that a phase shift between the output signal and the synchronisation signal depends on a difference between the natural frequency of the oscillator and the frequency of the synchronisation signal;
  a first load impedance onto which a load signal is applied;
  a second load impedance;
  a first coupling component periodically coupling the second load impedance to the first load impedance, at the synchronisation frequency.

17 Claims, 5 Drawing Sheets

(51) Int. Cl.
  *H03B 5/12*   (2006.01)
  *H03L 7/24*   (2006.01)
  *H03B 19/14*  (2006.01)
  *H03L 7/08*   (2006.01)

(52) U.S. Cl.
  CPC ......... *H03K 3/0315* (2013.01); *H03L 7/0805* (2013.01); *H03L 7/24* (2013.01); *H03B 2200/0074* (2013.01)

(58) Field of Classification Search
  CPC ...... H03K 4/50; H03K 3/0315; H03K 3/0322; H03L 7/24
  See application file for complete search history.

(56) References Cited

U.S. PATENT DOCUMENTS

| | | | |
|---|---|---|---|
| 2008/0129399 A1* | 6/2008 | Jang | H03B 19/14 |
| | | | 331/117 FE |
| 2008/0197894 A1* | 8/2008 | Jang | H03B 19/14 |
| | | | 327/118 |
| 2009/0251177 A1* | 10/2009 | Jang | H03B 19/14 |
| | | | 327/118 |
| 2010/0134152 A1 | 6/2010 | Benyahia et al. | |
| 2012/0019289 A1* | 1/2012 | Chang | H03B 5/1228 |
| | | | 327/118 |
| 2016/0099720 A1* | 4/2016 | Bashir | H03L 7/0991 |
| | | | 331/8 |
| 2017/0170834 A1* | 6/2017 | Sah | H03B 5/1212 |
| 2019/0356322 A1* | 11/2019 | Lin | H03B 5/1256 |

* cited by examiner

INJECTION-LOCKED OSCILLATOR WITH VARIABLE LOAD IMPEDANCE

TECHNICAL DOMAIN AND PRIOR ART

The invention relates to the field of injection-locked oscillators, particularly oscillators with very low electricity consumption and/or used in environments with large temperature variations.

Every oscillator has a natural frequency, or a free oscillation frequency, $f_0$, in other words a frequency at which the oscillator oscillates when no injection signal, also called a synchronisation signal, is applied to it. The oscillator can oscillate at a frequency $f_{inj}$ of an injection signal received by the oscillator, for example sent from another oscillator, provided that the power of the injection signal is sufficiently high and that the frequency $f_{inj}$ is not too different from the natural frequency $f_0$ of the oscillator. This property, called injection locking, is common to all types of oscillators: electrical, mechanical, optical, biological, etc.

Oscillators are characterised by a locking frequency range that corresponds to the frequency range of the injection signal that causes the oscillator to lock on the frequency $f_{inj}$. This frequency range depends particularly on the topology of the oscillator and the power of the injection signal.

Injection locked oscillators are used principally in radio frequency and millimetric circuits as frequency multipliers or dividers.

Injection locked oscillators can also be used as phase shifters. When the oscillator is locked by an injection signal with frequency the phase shift of the oscillator output signal (that has a frequency of $f_{inj}$) relative to the injection signal is a function of the difference in frequency $f_{inj}-f_0$. A programmable phase shifter can be made by modifying the natural frequency $f_0$ of the oscillator, for example by applying a signal on an analogue natural frequency control input $f_0$ of the oscillator (as is the case for a voltage-controlled oscillator VCO).

Such a phase shifter can be used to form a sensor interface circuit used to detect activity of a sensor. Document EP 3 312 568 A1 describes for example the use of such a phase shifter in a sensor interface circuit.

In the Internet of Objects (IOT) field, it is required to make sensor interfaces with very low electricity consumption and that function correctly even when subjected to large power supply voltage and temperature variations. Such a sensor interface can perform digital signal processing in the temporal domain, in other words convert a measured analogue signal into a temporal digital signal (the information of which for example corresponds to the signal phase or frequency), making for systems robust to temperature and power supply variations. More particularly, these architectures make use of circuits performing an analogue/time conversion that can be done by injection-locked oscillator used in phase shifters.

The method generally used for injection-locking of an electrical oscillator consists of applying a current with frequency $f_0$ on a node of the oscillator, or to apply a voltage with frequency $f_0$ on a branch of the oscillator. In practice, it is easier to inject a current in a node of an oscillator than to superpose a voltage onto a branch of the oscillator. On the other hand, the signals commonly used are generally voltages. One proposed solution consists of injecting a voltage with frequency $f_0$ on the gate of a transistor in order to convert it into a current.

Another locking mode used for locking on a frequency that is a harmonic of $f_0$ consists of modulating the biasing of the oscillator as a function of the injection signal.

Figure 1:
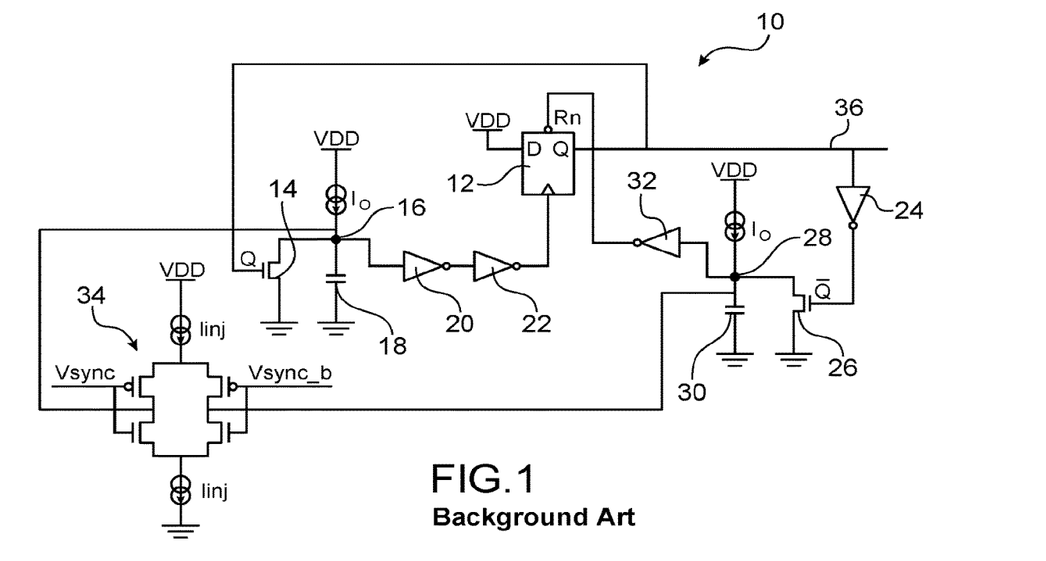
FIG. 1 shows an injection-locked oscillator used as a phase shifter.

FIG. 1 diagrammatically shows an injection-locked oscillator 10 used as a phase shifter. The oscillator 10 comprises a D flip-flop 12 with a data input D on which an electrical power supply potential VDD is applied. A Q output of the D flip-flop 12 is connected to the gate of a first transistor 14. One of the source or drain electrodes of the first transistor 14 is connected to the ground and the other of the source or drain electrodes of the first transistor 14 is connected to a first node 16. A first electrode of a first capacitor 18 is connected to this first node 16. A second electrode of the first capacitor 18 is connected to the ground. A load current $I_0$ is applied on the first node 16. This load current $I_0$ herein corresponds to a control signal received by the oscillator 10 (reception of this signal is symbolised by a current source on FIG. 1), for example a signal outputted by a sensor when the oscillator 10 is used to form a sensor interface. The first node 16 is also connected to the input of a first inverter 20. The output of the first inverter 20 is connected to the input of a second inverter 22. The output of the second inverter 22 is connected to the clock input of the D flip-flop 12.

The Q output of the D flip-flop 12 is also connected to the input of a third inverter 24, the output of which is connected to the gate of a second transistor 26. One of the source or drain electrodes of the second transistor 26 is connected to the ground and the other of the source or drain electrodes of the second transistor 26 is connected to a second node 28. A first electrode of second capacitor 30 is connected to the second node 28, and a second electrode of the second capacitor 30 is connected to the ground. The current $I_0$ is applied on the second node 28. The second node 28 is also connected to the input of a fourth inverter 32. The output of the fourth inverter 32 is connected to a reset input 12 of the D flip-flop.

The oscillator 10 also comprises an injection circuit 34. The injection circuit 34 comprises four MOS transistors used as switches and connected to each other in a manner similar to charge pumps of phase locking loops. Synchronisation signals $V_{sync}$ and $V_{sync\_b}$ (inverse signal of $V_{sync}$), corresponding to periodic signals with frequency are applied on the gates of four MOS transistors, so that the circuit 34 outputs an injection signal with frequency corresponding to a current $I_{inj}$, onto nodes 16 and 28. The synchronisation signals $V_{sync}$ and $V_{sync\_b}$ may for example by output by another oscillator.

The function of the circuit 34 is to alternately add and subtract the current $I_{inj}$ to or from the current $I_0$ at the rate of synchronisation signals, specifically at frequency $f_{inj}$. The first and second capacitors 18, 30 are changed alternately. The oscillator 10 oscillates at the frequency of the synchronisation signals, in other words at frequency $f_{inj}$, and adjusts the phase shift of the signal obtained on an output 36 of the oscillator 10 (corresponding to the signal output on the Q output of the D flip-flop 12) relative to the injection signal such that the value of the load current passing through the capacitors 18 and 30 is equal to the value of the current that would have had to be used such that the free oscillation frequency of the oscillator 10 without injection would be equal to the frequency of the injection signal.

In the oscillator 10, the phase shift φ obtained between the signal outputted on the output 36 and the injection signal is expressed by the following equation:

$$\varphi = \frac{\pi}{2}\left[\frac{I_0}{I_{inj}}\left(\frac{f_{inj}}{f_0} - 1\right) + 1\right]$$

If the currents $I_0$ and $I_{inj}$ were output of the same current source, these currents would have the same dependence on temperature, so that variations of the phase shift φ as a function of temperature could be minimised. However, in practice, these currents are not output from the same current source and pairing errors make it impossible to guarantee the same dependence on temperature of the different current sources, especially for large temperature variations, for example of more than 100° C. Therefore in the general case, since these two magnitudes $I_0$ and have different temperature behaviours, the locking frequency range of the oscillator 10 depends on the temperature of the operating environment of the oscillator 10. Therefore such an oscillator 10 is not adapted to operate in environments subject to large temperature constraints.

Furthermore, currents $I_{inj}$ and $I_0$ depend on the power supply voltage $V_{DD}$ of the oscillator 10. Pairing defects of current sources from which these currents are derived make it impossible to obtain identical dependence on the power supply voltage. Thus, the phase shift obtained also depends on the power supply voltage $V_{DD}$ of the oscillator 10.

Furthermore, the oscillator 10 requires that the current $I_{inj}$ is supplied continuously so that it can lock itself. Electricity consumption related to this current injection can be penalising, particularly when the oscillator 10 will be used for applications with very low electricity consumption, for example in the IOT field.

Presentation of the Invention

Therefore there is a need to disclose an injection-locked oscillator with a lower electricity consumption than injection-locked oscillator according to prior art, and that is adapted to operate in environments subject to large temperature variations.

This is why an injection-locked oscillator is disclosed, comprising at least:
- one or several control inputs configured to receive one or several control signals, the oscillator being configured such that the value of its natural frequency, or its free oscillation frequency, depends on the amplitude of the control signal(s);
- a synchronisation input configured to receive a periodic synchronisation signal, the oscillator being configured to output an output signal with a frequency equal to the frequency of the synchronisation signal when the oscillator is locked to the frequency of the synchronisation signal, and such that a phase shift between the output signal and the synchronisation signal depends on a difference between the natural frequency of the oscillator and the frequency of the synchronisation signal;
- a first load impedance, the oscillator being configured such that a load signal, for example corresponding to a load current, is applied to the first load impedance;
- a second load impedance;
- a first coupling component configured to periodically couple the second load impedance to the first load impedance, at the frequency of the synchronisation signal, in parallel or in series.

Such an oscillator discloses a new method of injection-locking that reduces consumption of the oscillator. In this oscillator, injection-locking is done by periodically changing the value of the load impedance that changes from the value of the first load impedance alone to the value of the assembly composed of the first and second load impedances, at the frequency of the synchronisation signal. Therefore in this oscillator, locking is not done by periodically injecting an injection current into the oscillator, but rather by periodically modifying the value of the load impedance which reduces the electricity consumption of the oscillator. For example, such an oscillator may consume only a few nW.

Therefore such an oscillator is advantageously used in domains in which there are constraints on electricity consumption, for example such as 10T.

Furthermore, in this oscillator, the locking frequency range of the oscillator does not depend on the amplitude of the injection signal and the amplitude of the oscillator signal at the terminals of the branch of the oscillator into which the injection signal is input. In the disclosed oscillator, the locking frequency range depends only on the ratio of the variation of the value of the load impedance from its nominal value. Therefore this oscillator has a better controlled locking frequency range independent of variations in the temperature and the power supply voltage.

The oscillator may be a relaxation oscillator.

The first coupling component may comprise at least one first coupling transistor coupled in series or in parallel to the second load impedance. When the first coupling transistor is coupled in series with the second load impedance, it may or may not connect the second load impedance, which may be coupled to the first load impedance in parallel, depending on whether it is conducting or blocked. When the first coupling transistor is coupled in parallel to the second load impedance, it may or may not short circuit the second load impedance, which may be coupled to the first load impedance in series, depending on whether it is conducting or blocked.

In a first embodiment, the oscillator may also comprise at least:
- a third load impedance, the oscillator being configured such that the load signal is applied on the third load impedance;
- a fourth load impedance;
- a second coupling component configured to periodically couple the fourth load impedance to the third load impedance, at the frequency of the synchronisation signal, in parallel or in series.

In the first embodiment, the oscillator may also comprise:
- a flip-flop, of which a clock input is coupled to the first and second load impedances, including a reset input coupled to the third and fourth load impedances, and an output configured to output the oscillator output signal, or
- a lock, of which an input setting the lock into the low state is coupled to the first and second load impedances, of which an input setting the lock into the high state is coupled to the third and fourth load impedances, and of which an output is configured to output the oscillator output signal.

The flip-flip is for example a D flip-flop. The lock is for example by an RS lock.

In this case, a gate of the first coupling transistor may be coupled to an output of a first NOR logical gate, a first input of which is coupled to the output of the flip-flop or the lock and a second input of which is configured to receive the synchronisation signal.

The second coupling component may comprise at least one second coupling transistor coupled in series or in parallel to the fourth load impedance.

In this case, a gate of the second coupling transistor may be coupled to an output of a second NOR logic gate, a first input of which is coupled to an inverted output of the flip-flop or the lock and a second input of which is configured to receive an inverted signal of the synchronisation signal.

Furthermore, the oscillator may comprise the flip-flop or the lock and:
- a first discharge transistor coupled in parallel to the first and second load impedances, the gate of which is coupled to the output of the flip-flop or the lock;
- a second discharge transistor coupled in parallel to the third and fourth load impedances, the gate of which is coupled to an inverted output of the flip-flop or the lock.

In this case, the first and second discharge transistors alternate the charge and discharge phases of the load impedances.

Furthermore, the oscillator may comprise the flip-flop or the lock and:
- a first input transistor, a gate of which is coupled to the output of the flip-flop or the lock and configured such that the load signal, corresponding to a load current, is or is not applied on the first load impedance as a function of the conducting or blocked state of the first input transistor;
- a second input transistor, a gate of which is coupled to an inverted output of the flip-flop or the lock and configured such that the load signal is or is not applied on the third load impedance as a function of the conducting or blocked state of the second input transistor.

Such input transistors can further reduce the electricity consumption of the oscillator because they make it possible to apply the load signal on load impedances only during charging phases of these impedances.

The control input or a first of the control inputs may be coupled to the first load impedance such that the control signal or a first of the control signals forms the load signal. In this case, the natural frequency at which the oscillator oscillates may be controlled through the amplitude of the load signal.

Each of the load impedances may comprise at least one capacitor, or at least one capacitive component. As a variant, it is also possible that load impedances correspond to coils, or inductive components.

The oscillator may be such that:
- the first load impedance comprises at least one first capacitor and, when the oscillator comprises the third load impedance, the third load impedance comprises at least one second capacitor, or
- the first load impedance comprises at least one first capacitive transducer forming the control input or a second of the control inputs, the value of the natural frequency of the oscillator being a function of the value of the capacitance of the first capacitive transducer, and when the oscillator comprises the third load impedance, the third load impedance comprises at least one second capacitive transducer forming the control input or the second of the control inputs, the value of the natural frequency of the oscillator being a function of the value of the capacitance of the second capacitive transducer.

In the above configuration, the natural frequency at which the oscillator oscillates can therefore be a function of the values of capacitances of the capacitive transducers, these capacitance values possibly depending for example on one or several signals (for example a pressure, an electric field, a force, etc.) received by the capacitive transducers and corresponding to the control signal(s).

The oscillator may comprise the flip-flop or the lock, and each of the load impedances may be coupled to the flip-flop or the lock by means of at least one inverter, of which a threshold voltage control input forms the control input, or a third of the control inputs. In this case, the natural frequency at which the oscillator oscillates may be a function of the value of the threshold voltage(s) of the inverter(s) coupling the load impedances to the flip-flop or to the signal lock, and therefore a function of the control signals applied on the control input of the inverter(s).

In a second embodiment, the oscillator may be a harmonic oscillator comprising at least one LC circuit, in other words a circuit comprising at least one capacitive component and at least one inductive component.

In a third embodiment, the oscillator may be a ring oscillator comprising at least an odd number of inverters greater than or equal to three, and such that an output of one of the inverters is coupled to the first load impedance.

According to one advantageous variant of this third embodiment, an output of each of the inverters may be coupled to a load impedance and to a coupling component configured to periodically couple another load impedance to said load impedance, at the frequency of the synchronisation signal and in parallel or series.

An interface circuit for a sensor is also disclosed, comprising at least one injection-locked oscillator as described previously, and a second oscillator of which an output is coupled to the second input of the injection-locked oscillator.

BRIEF DESCRIPTION OF THE DRAWINGS

This invention will be better understood after reading the description of example embodiments given purely for information and that is in no way limitative, with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

The different possibilities (variants and embodiments) must be understood as not being mutually exclusive and can be combined with each other.

DETAILED PRESENTATION OF PARTICULAR EMBODIMENTS

An injection-locked oscillator 100 according to a first embodiment is described below with reference to FIG. 2.

The oscillator 100 comprises a flip-flop 102 that, in the first embodiment, corresponds to a D flip-flop. The flip-flop 102 comprises a D data input coupled to an electric power supply potential VDD. A Q output of the D flip-flop 102 is connected to an output 103 of the oscillator 100 and is coupled to the gate of a first discharge transistor 104. A first electrode of the first discharge transistor 104, corresponding to the drain of the first discharge transistor 104 that is of the N type, is coupled to a first node 106. A second electrode of the first discharge transistor 104, corresponding to the source of the first discharge transistor 104, is coupled to the ground.

The oscillator 100 also comprises a first load impedance 108. In this first embodiment, this first load impedance 108 corresponds to a first capacitor, or more generally a first capacitive component, with value $C_1$. A first electrode of the first capacitor is coupled to the first node 106, and a second electrode of the first capacitor is coupled to the ground.

Figure 2:
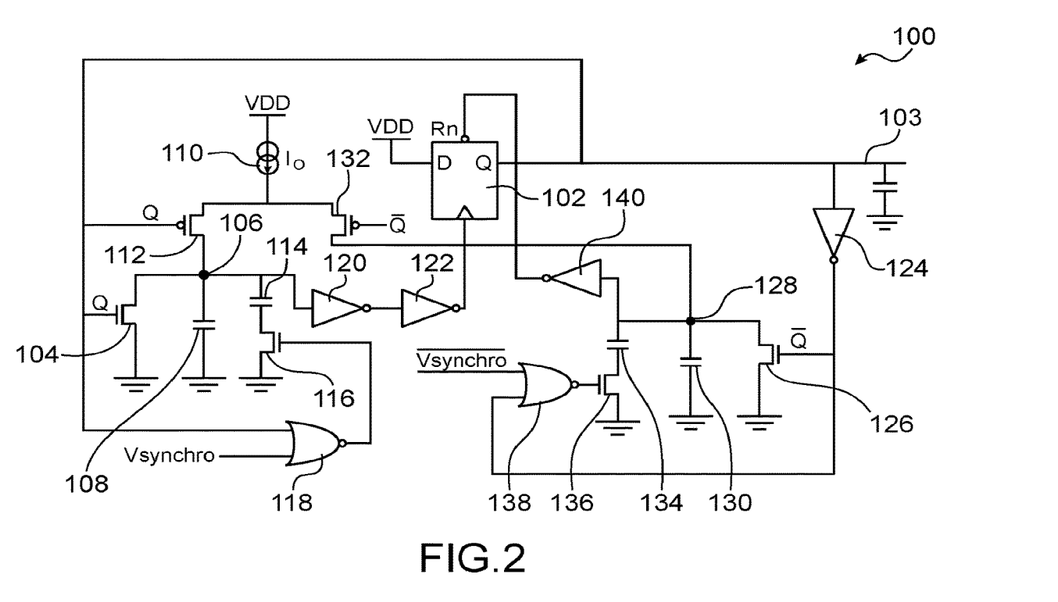
FIG. 2 shows an injection-locked oscillator according to a first embodiment.

A load current $I_0$, in this case corresponding to a control signal received by the oscillator 100 (this control signal is symbolised by a current source 110 on FIG. 2) is applied on the first node 106, and therefore on the first load impedance 108, through a first input transistor 112. The Q output of the flip-flop 102 is coupled to the gate of the first input transistor 112.

The oscillator 100 also comprises a second load impedance 114, and a first coupling component 116 controlled and configured to periodically couple the second load impedance 114 to the first load impedance 108. In this first embodiment, this second load impedance 114 corresponds to a second capacitor, or a second capacitive component, with value $C_{synchro1}$ and the first coupling component 116 corresponds to a first coupling transistor 116. A first electrode of the second capacitor is connected to the first node 106. A second electrode of the second capacitor is connected to a first electrode of the first coupling transistor 116, and corresponds to the drain of the first coupling transistor 116 that is of the N type. A second electrode of the first coupling transistor 116, corresponding to the source of the first coupling transistor 116, is coupled to the ground.

The gate of the first coupling transistor 116 is coupled to the output of a first NOR logic gate 118 comprising a first input coupled to the Q output of the flip-flop 102 and a second input onto which a synchronisation signal $V_{synchro}$, with frequency $f_{synchro}$, is applied. For example, the synchronisation signal corresponds to a square signal of which the high and low values are approximately equal to the values of the signal outputted on the Q output of the flip-flop 102. Due to the first NOR logic gate 118, the second load impedance 114 is coupled in parallel to the first load impedance 108 when the synchronisation signal $V_{synchro}$ and the output signal from the flip-flop 102 are both in the low state.

The first node 106 is also coupled to the input of a first inverter 120, the output of this first inverter 120 being coupled to the input of a second inverter 122. The output of the second inverter 122 is coupled to the clock input of the flip-flop 102. These inverters 120, 122 straighten the front of the signal obtained on the first node 106 before it is applied on the clock input of the flip-flop 102.

The Q output of the flip-flop 102 is also coupled to the input of a third inverter 124. Alternatively, the signal obtained on the output of the third inverter 124 corresponding to the inverted output signal $\overline{Q}$, could be obtained on an inverted output of the flip-flop 102. The output of the third inverter 124 is coupled to the gate of a second discharge transistor 126.

A first electrode of the second discharge transistor 126, corresponding to the drain of the second discharge transistor 126 that is of the N type, is coupled to a second node 128. A second electrode of the second discharge transistor 126, corresponding to the source of the second discharge transistor 126, is coupled to the ground.

The oscillator 100 also comprises a third load impedance 130. In this first embodiment, this third load impedance 130 corresponds to a third capacitor, or a third capacitive component, with value $C_2$. A first electrode of the third capacitor is coupled to the second node 128, and a second electrode of the third capacitor is coupled to the ground.

The load current $I_0$ is applied on the second node 128, and therefore on the third load impedance 130, through a second input transistor 132. The inverted output signal $\overline{Q}$ of the flip-flop 102 is applied on the gate of the second input transistor 132.

The oscillator 100 also comprises a fourth load impedance 134, and a second coupling component 136 controlled and configured to periodically couple the fourth load impedance 134 to the third load impedance 108. In this first embodiment, this fourth load impedance 134 corresponds to fourth capacitor, or a fourth capacitive component, with a value $C_{synchro2}$ and the second coupling component 136 corresponds a second coupling transistor.

The values of the capacitors of the oscillator 100 herein are such that $C_1/C_{synchro1} = C_2/C_{synchro2}$.

A first electrode of the fourth capacitor is connected to the second node 128. A second electrode of the fourth capacitor is connected to a first electrode of the second coupling transistor, corresponding to the drain of the second coupling transistor that is of the N type. A second electrode of the second coupling transistor, corresponding to the source of the second coupling transistor, is coupled to the ground.

The gate of the second coupling transistor is coupled to the output of a second NOR logic gate 138 comprising a first input coupled to the output of the third inverter 124 and a second input onto which an inverted signal of the synchronisation signal $V_{synchro}$, called $\overline{V_{synchro}}$ and with frequency $f_{synchro}$, is applied. Due to the second NOR logic gate 138, the fourth load impedance 134 is coupled in parallel to the third load impedance 130 when the signal $\overline{V_{synchro}}$ and the inverted output signal $\overline{Q}$ of the flip-flop 102 are both in the low state.

The second node 128 is also coupled to the input of a fourth inverter 140, the output of which is coupled to a reset input of the flip-flop 102. This inverter 140 straightens the signal front obtained on the second node 128 before it is applied on the reset input of the flip-flop 102.

In the oscillator 100 described above, the transistors 104, 112, 116, 126, 132 and 136 may for example be MOSFET transistors. However, other types of transistor may be used.

In the oscillator 100 shown on FIG. 2, the control signal corresponding to the load current $I_0$ directly controls the natural frequency of the oscillator 100. The value of the natural frequency $f_0$ of the oscillator 100 is a function of the amplitude of the load current $I_0$, and therefore of the amplitude of the control signal received by the oscillator 100. This control signal may correspond to a measurement signal received by the oscillator 100, or it may correspond to a signal obtained from a measurement signal, for example a signal outputted at the output of a transconductance amplifier, one input of which receives the measurement signal.

In this oscillator 100, synchronisation is not done by an injection of current (or voltage) additive to and then subtractive from the control signal of the oscillator 100 at the frequency of the synchronisation signal, but by a modification of the value of the load impedance(s) (the first and third load impedances 108, 130 in the first embodiment described above) of the oscillator 100, made at the frequency of the synchronisation signal $f_{synchro}$. The value of this or these load impedances is modified by periodically coupling and decoupling one or several other load impedances (the second and fourth load impedances 114, 134 in the first embodiment described above), in series or in parallel (in parallel in the first embodiment described above) to this or these load impedances. Therefore in the first embodiment described above, the first load assembly comprising the first and second load impedances 108, 114 forms a capacitance for which the value alternates between the values $C_1$ and $C_1+C_{synchro1}$. Therefore, similarly, the second load assembly comprising the third and fourth load impedances 130, 134 forms a capacitance for which the value alternates between the values $C_2$ and $C_2+C_{synchro2}$.

Thus, the oscillator 100 locks onto the frequency $f_{synchro}$ of the synchronisation signal $V_{synchro}$ by adjusting the phase of the signal outputted on the output 103, such that the value of the average load impedance of the oscillator 100 is equal to the value necessary such that the oscillator 100 is in free oscillation (with no synchronisation signal at the input to the oscillator 100) at the frequency $f_{synchro}$ of the synchronisation signal. Thus, the phase shift between the output signal outputted on the output 103 and the synchronisation signal $V_{synchro}$ is a function of the difference between the natural frequency $f_0$ of the oscillator 100 and the frequency $f_{synchro}$ of the synchronisation signal $V_{synchro}$.

When $C_1=C_2$ and $C_{synchro1}=C_{synchro2}$, the signal obtained on the output 103 of the oscillator 100 has a cyclic ratio equal to 50% (on a period of this output signal, the duration of the high state is equal to the duration of the low state). The phase shift $\varphi$ obtained between the synchronisation signal and the signal outputted on the output 103 of the oscillator 100 is then expressed by the following equation:

$$\varphi = \pi \left[ \frac{f_{synchro}}{f_0} \left( \frac{C_1}{C_{synchro1}} + 1 \right) - \frac{C_1}{C_{synchro1}} \right]$$

In the above equation, the different terms (ratios $C_1/C_{synchro1}$ and $f_{synchro}/f_0$) are independent of the temperature of the environment in which the oscillator 100 functions when the oscillator producing the signal $V_{synchro}$ has the same topology as the injection-locked oscillator. Therefore the locking frequency range of the oscillator 100 is not dependent on this temperature, but is dependent on the variation of the value of load assemblies relative to their nominal value, in other words the total value of the first and second load impedances and the total value of the third and fourth load impedances relative to the value of the first load impedance alone and the value of the third load impedance alone, respectively. Furthermore, the locking frequency range of the oscillator 100 no longer depends on the amplitude of the control and synchronisation signals received by the oscillator 100.

According to one variant embodiment, the values of capacitors $C_1$ and $C_2$ may be different from each other. In this case, the signal obtained on the output 103 of the oscillator 100 has a cyclic ratio $\alpha$ different from 50%. In this variant, when the cyclic ratio $\alpha$ is more than 50% and the oscillator 100 does not have the fourth load impedance 134, the phase shift $\varphi$ obtained is expressed by the following equation:

$$\varphi = 2 \cdot \pi \cdot \left[ \left( 1 + \frac{C_1}{C_{synchro1}} \right) \left[ \frac{f_{synchro}}{f_0} + \alpha \left( \frac{C_{synchro1}}{C_1 + C_{synchro1}} \right) - 1 \right] \right]$$

In particular, with such a variant the oscillator 100 can form a phase shifter that is linear over a phase range of more than pi.

In the first embodiment described above, the oscillator 100 corresponds to a relaxation oscillator. The principle described above consisting of modifying the value of the load impedance(s) of the oscillator at the frequency of the synchronisation signal received by the oscillator may be applied to relaxation oscillators different from that described above.

In the first embodiment described above, the oscillator 100 comprises input transistors 112, 132 that may be used to send the load current $I_0$ onto either node 106 or 128 depending on the value of the output signal outputted on the Q output of the flip-flop 102. Therefore these input transistors 112, 132 can reduce the electricity consumption of the oscillator 100 due to the fact that the load current is not permanently applied on the first and second nodes 106, 128. However as a variant, the oscillator 100 does not necessarily comprise these input transistors 112, 132, and in this case the load current $I_0$ is sent simultaneously and permanently on the nodes 106, 128.

In the oscillator 100 made according to the first embodiment described above, the values of the capacitances $C_{synchro1}$ and $C_{synchro2}$ (corresponding to the second and fourth load impedances) may be chosen in particular as a function of variations in the load current $I_0$. If the variations in the load current $I_0$ are small, for example of the order of 10%, the values $C_{synchro1}$ and $C_{synchro2}$ of the second and fourth load impedances 114, 134 are advantageously chosen to be low, for example of the order of one tenth of the values $C_1$ and $C_2$.

Furthermore, the values of the capacitors $C_{synchro1}$ and $C_{synchro2}$ may be less than, equal to or even more than the values of capacitors $C_1$ and $C_2$.

An injection-locked oscillator 100 according to a first variant of the first embodiment is described below with reference to FIG. 3.

Figure 3:
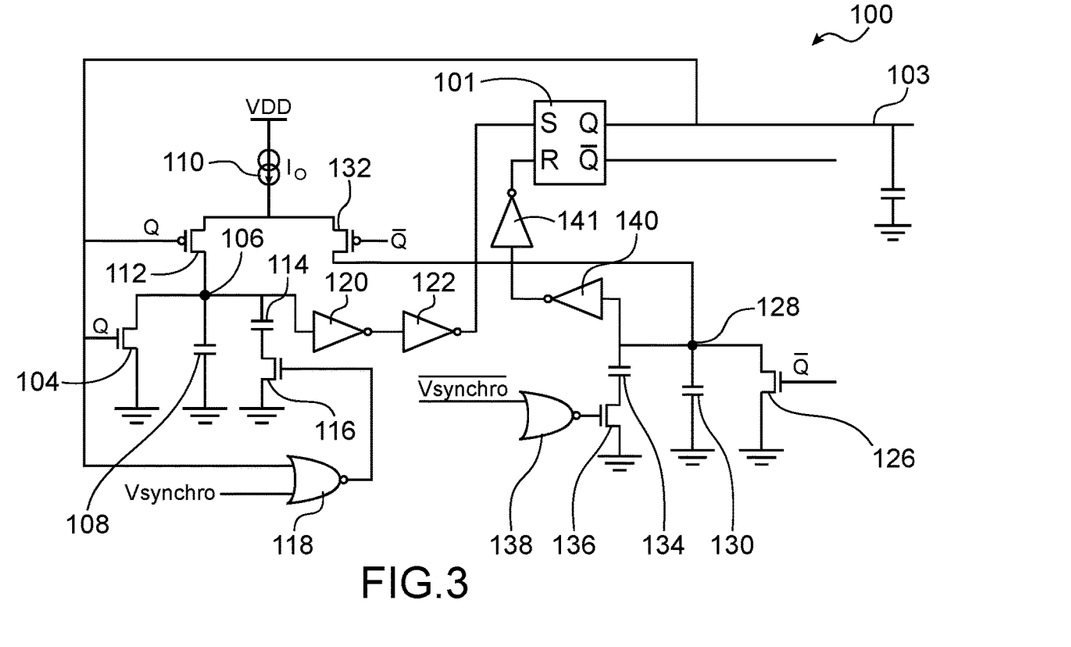
FIG. 3 shows an injection-locked oscillator according to a first variant of the first embodiment.

In this first variant shown on FIG. 3, the flip-flop 102 is replaced by a lock 101. In the example embodiment shown on FIG. 3, the lock 101 is an RS lock.

The first node 106 is coupled to the input S of the lock 101, in other words the input that sets the lock 101 to the high state, through the first and second inverters 120, 122 connected to each other in series.

The second node 128 is coupled to the input R of the lock 101, in other words to the input that sets the lock 101 to the low state, through the fourth inverter 140 and another inverter 141 connected to each other in series.

Like the Q output of the flip-flop 102 of the oscillator 100 shown on FIG. 2, in this case the Q output of the lock 101 is connected to the output of the oscillator 100 and is coupled to the gate of the first discharge transistor 104, to the gate of the first input transistor 112 and to the first input of the first NOR logic gate 118.

The inverted output $\overline{Q}$ of the lock 101 is obtained directly from the lock 101, since the oscillator 100 shown on FIG. 3 does not have the third inverter 124. This inverted output $\overline{Q}$ of the lock 101 is coupled to the gate of the second discharge transistor 126, to the gate of the second input transistor 132 and to the first input of the second NOR logic gate 138.

Operation of the oscillator 100 according to this first variant of the first embodiment is similar to operation of the oscillator described above with reference to FIG. 2.

Figure 4:
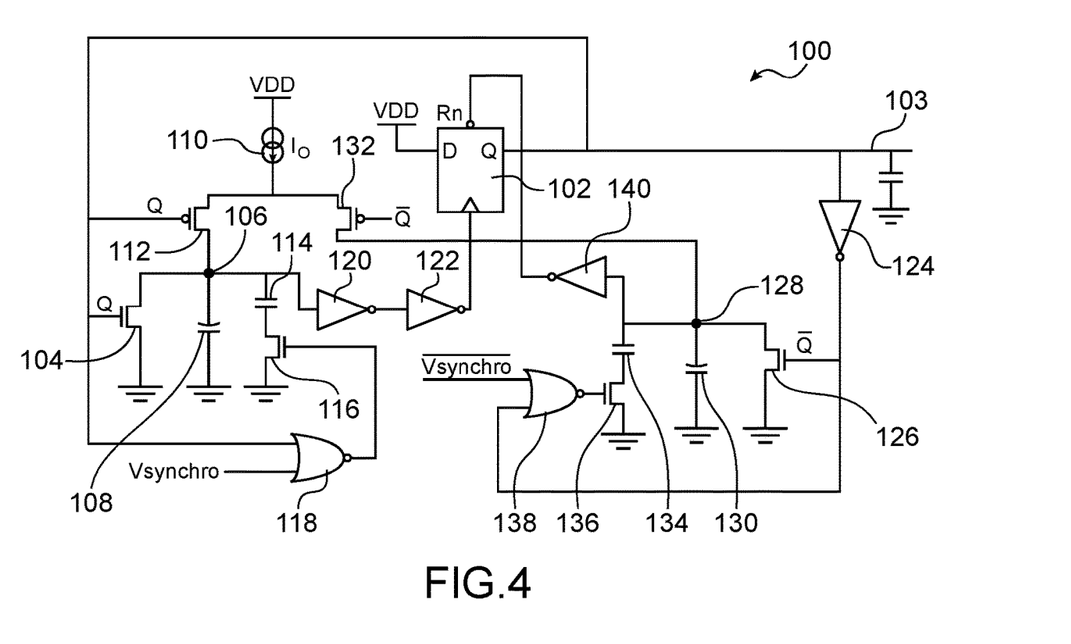
FIG. 4 shows an injection-locked oscillator according to a second variant of the first embodiment.

An injection-locked oscillator 100 according to a second variant of the first embodiment is described below with reference to FIG. 4.

Compared with the oscillator 100 previously described with reference to FIG. 2, the first and third load impedances 108 do not correspond to capacitors forming capacitances with fixed values, but correspond to capacitive transducers forming capacitances with values that vary as a function of a control signal received by the first and third load impedances 108, 130. For example, this control signal corresponds to a pressure, an electric field, or a force received by the capacitive transducers.

The value of the natural frequency of the oscillator 100 depends on the capacitance values of the first and third load impedances 108, 130. Advantageously, the load current $I_0$ corresponds to a current with a constant value, in other words the value of which does not depend on a control signal received by the oscillator 100. Thus, the natural frequency of the oscillator 100 varies only as a function of variations in the control signal received by the first and third load impedances 108, 130.

As a variant, the value of the load current $I_0$ may be a function of a control signal received by the oscillator 100 and different from the value that varies the capacitance values of the first and third load impedances. In this case, the value of the natural frequency of the oscillator 100 depends on the amplitude of each of these two control signals.

According to another embodiment, it is possible that the oscillator 100 is made according to the two variants described above, in other words it comprises the lock 101 and the capacitive transducers forming the first and the third load impedances 108, 130.

Figure 5A:
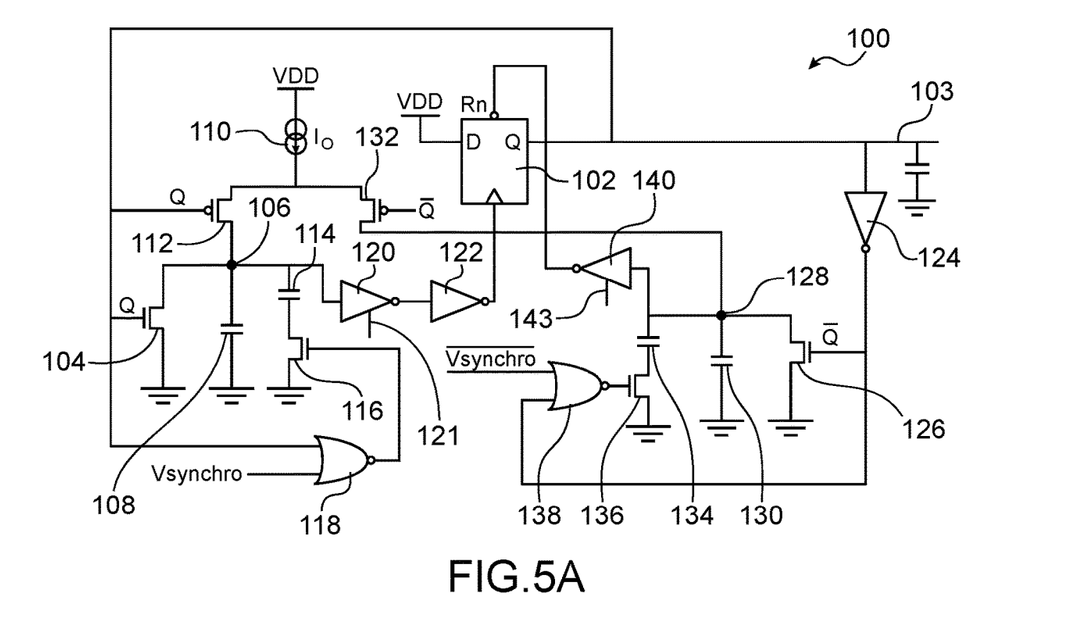
FIG. 5A shows an injection-locked oscillator according to a third variant of the first embodiment.

An injection-locked oscillator 100 according to a third variant of the first embodiment is described below with reference to FIG. 5A.

Figure 5B:
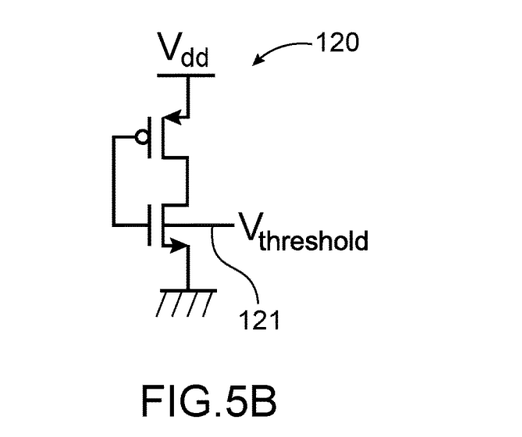
FIG. 5B shows a controlled threshold voltage inverter used in the injection-locked oscillator according to the third variant of the first embodiment.

Compared with the oscillator 100 described above with reference to FIG. 2, each of the first and fourth inverters 120 and 140 of the oscillator 100 according to this third variant comprises a control input 121, 143 on which a control signal is applied to control the threshold voltage of the inverters 120, 140. An example embodiment of such an inverter is shown in FIG. 5B.

The value of the natural frequency of the oscillator 100 is a function of the values of the threshold voltages of the inverters 120, 140, and therefore in this case depends on the amplitude of the control signal applied on the control inputs 121, 143 of the inverters 120, 140. According to one embodiment, the load current $I_0$ may correspond to a current with a constant value, in other words the value of which does not depend on a control signal received by the oscillator 100. Thus, the value of the natural frequency of the oscillator 100 depends only on the values of the threshold voltages of the inverters 120, 140, and therefore-on the control signals applied on the control inputs 121, 143 of the inverters 120, 140. However as a variant, the load current $I_0$ may be a function of another control signal received by the oscillator 100, and in this case the natural frequency of the oscillator 100 depends on the amplitudes of the two received control signals.

According to another embodiment, the other inverters 122 and 124 of the oscillator 100 may also have a control input that may be used to vary their threshold voltage.

This third variant may be combined with either or both of the first and second variants described above. Thus, the oscillator 100 according to this third variant may also comprise a lock 101 as described previously with reference to FIG. 3, and/or may comprise capacitive transducers forming the first and third load impedances 108, 130.

Figure 6:
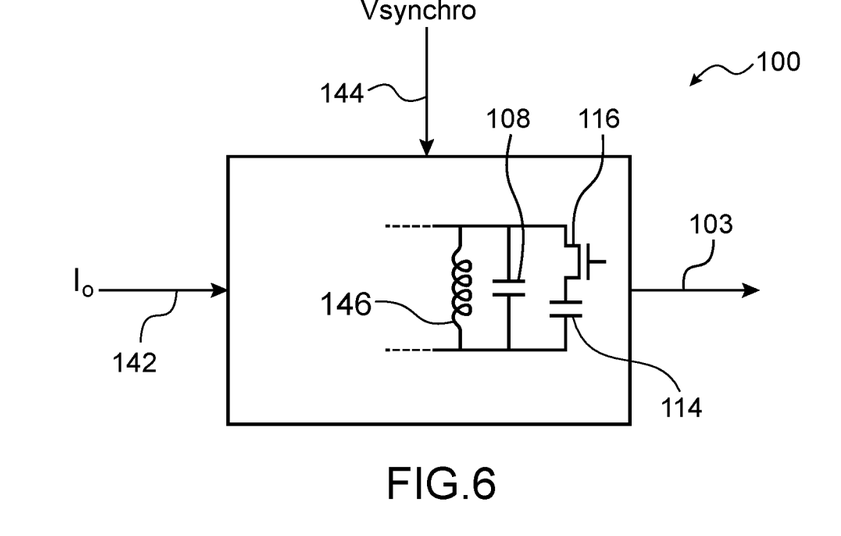
FIG. 6 shows an injection-locked oscillator according to a second embodiment.

In a second embodiment, the oscillator 100 may correspond to a harmonic oscillator. FIG. 3 diagrammatically shows part of such an oscillator 100.

The oscillator 100 according to this second embodiment comprises a first input 142 on which the control signal $I_0$ is applied. The oscillator 100 comprises a second input 144 on which the synchronisation signal $V_{synchro}$ is applied.

In this second embodiment, the oscillator 100 is of the LC type and comprises an inductance, or coil, 146 coupled in parallel to the first load impedance 108 in this case corresponding to a capacitor. The second load impedance 114, also corresponding to a capacitor in this example embodiment, is coupled in series with the first coupling component 116, for example a coupling transistor, the assembly being coupled in parallel to the first load impedance 108. As in the first embodiment, a signal with frequency $f_{synchro}$ is applied on the gate of the first coupling transistor 116.

The oscillator 100 also comprises other electronic components, for example such as a crossed pair of transistors designed to maintain oscillations by compensating for losses in the LC circuit, that are not described in detail herein.

As in the first embodiment, the oscillator 100 according to this second embodiment has a load impedance with a value that is periodically modified, as a function of the frequency of the synchronisation signal applied on the oscillator 100. As previously described for the first embodiment, the phase shift φ obtained between the synchronisation signal and the signal outputted on the output 103 of the oscillator 100 is representative of the difference $f_0-f_{synchro}$.

In the second embodiment described above, the oscillator 100 corresponds to an LC oscillator. The principle described above consisting of modifying the value of the load impedance at the frequency of the synchronisation signal received by the oscillator 100 may be applied to harmonic oscillators different from that described above.

Figure 7:
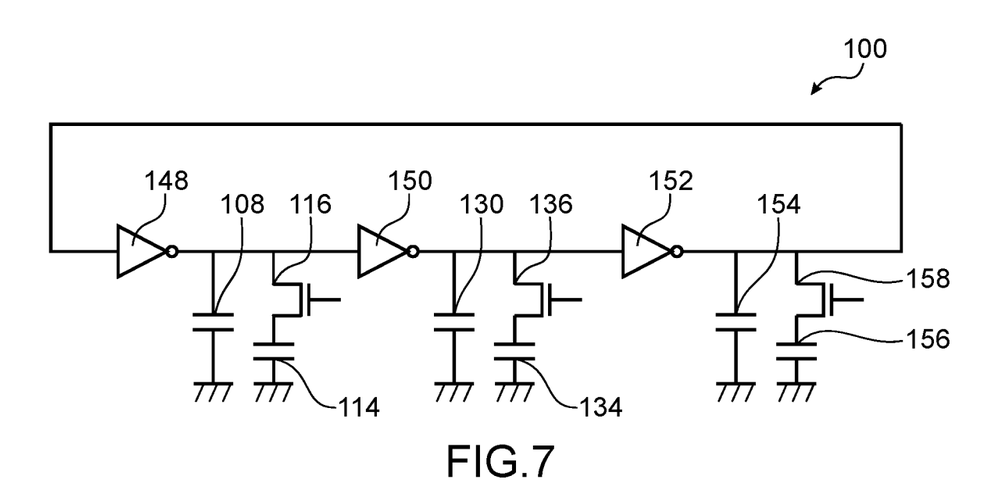
FIG. 7 shows an injection-locked oscillator according to a third embodiment.

In a third embodiment, the oscillator 100 may correspond to a ring oscillator. FIG. 7 diagrammatically shows such an oscillator 100.

The oscillator 100 according to this third embodiment comprises three inverters 148, 150 and 152 coupled in series and looped, the output of the third inverter 152 being coupled to the input of the first inverter 148. In general, the ring oscillator 100 comprises an odd number of inverters greater than or equal to three.

The output of the first inverter 148 is coupled to a first electrode of the first load impedance 108, the second electrode of the first load impedance 108 being connected to the ground. As in the previous two embodiments, the first load impedance 108 corresponds to a capacitor.

The second load impedance 114 and the first coupling component 116 corresponding to a capacitor and a transistor respectively, form an assembly coupled in parallel to the first load impedance 108.

The output of the second inverter 150 is coupled to a first electrode of the third load impedance 130, the second electrode of the third load impedance 130 being connected to the ground. As in the previous two embodiments, the third load impedance 130 corresponds to a capacitor. The fourth load impedance 134 and the second coupling component 136 corresponding to a capacitor and a transistor respectively, form an assembly coupled in parallel to the third load impedance 130.

The output of the third inverter 152 is coupled to a first electrode of a fifth load impedance 154, the second electrode of the fifth load impedance 154 being connected to the ground. The fifth load impedance 154 corresponds to a capacitor. A sixth load impedance 156 and a third coupling component 158 corresponding to a capacitor and a transistor respectively, form an assembly coupled in parallel to the fifth load impedance 154.

As in the previous embodiments, the gates of the coupling transistors 116, 136 and 158 receive a signal with frequency f synchro thus modulating the value of load impedances coupled to the outputs of inverters 148, 150 and 150 at this frequency. However, the signals applied on the gates of coupling transistors 116, 136, 158 are out-of-phase with each other such that the modulation of the value of each of the load impedances takes place at different moments. This, in the example in FIG. 7, these signals are out-of-phase with each other by $2\pi/3$. In general, in such a ring oscillator, the phase shift between the synchronisation signals applied on the gates of the coupling transistors is $2\pi/n$, in which n corresponds to the number of inverters in the oscillator 100.

The phase shift $\varphi$ obtained between the synchronisation signal and the signal outputted on the output 103 of the oscillator 100 is similar to that previously described for the first embodiment except for a gain factor, in other words it is a function of the number of inverters included in the oscillator 100.

In the configuration shown on FIG. 7, the output of each of the inverters of the oscillator 100 is coupled to a load impedance and to a coupling component configured to periodically couple another load impedance to said load impedance, at the frequency of the synchronisation signal and in parallel or series. As a variant, it is possible that only one of the inverters of the oscillator 100 has its output coupled to a load impedance with a variable value. In this case, and reconsidering the configuration shown on FIG. 7, the oscillator 100 does not have any load impedances 134, 156 nor coupling components 136, 158.

In a relaxation oscillator like that described above with reference to FIG. 2, the phase shift is linear over the entire locking range of the oscillator 100. On the other hand, in other types of oscillator such as for example a harmonic oscillator, this phase shift is not linear over the entire locking range of the oscillator. In this case, it is preferable if the oscillator is configured to function on a part of this locking range in which the phase shift varies linearly.

In the embodiments described above, the second load impedance 114 is coupled in parallel to the first load impedance 108 by the coupling component 116. As a variant, the second load impedance 114 may be coupled in series with the first load impedance 108 by the coupling component 116. In this case, the first and second load impedances 108, 114 may be connected with each other in series, and the coupling component 116, for example consisting of a transistor, may be coupled in parallel to the second load impedance 114. Thus, when the coupling component 116 is in the blocked state, the second load impedance 114 is not short circuited by the coupling component 116 and therefore the global value of the load impedance of the oscillator 100 is modified by the addition of the value of the second load impedance 114. When the coupling component 116 is in the conducting state, the second load impedance 114 is short circuited by the coupling component 116, and therefore it does not modify the global value of the load impedance of the oscillator 100. This configuration may for example be applicable for the oscillator 100 described above for the second embodiment, by coupling a second inductive component in series with the inductive component 146.

Figure 8:
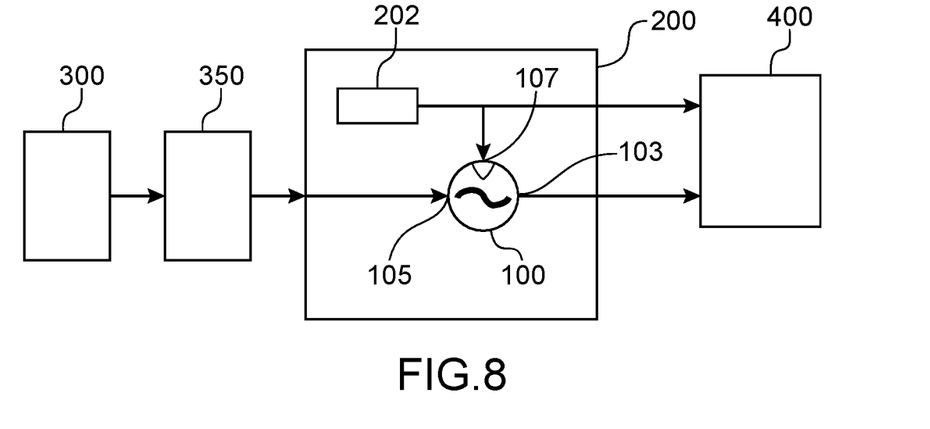
FIG. 8 shows an interface circuit for a sensor according to one particular embodiment.

Regardless of its embodiment, the oscillator 100 may be used in an interface circuit 200 for a sensor. FIG. 8 diagrammatically shows such an configuration.

The interface circuit 200 comprises an injection-locked oscillator 100 made according to one of the previously described embodiments. The oscillator 100 receives a data signal (corresponding to the control signal $I_0$ in the previously described embodiments) on a first input sent from an amplifier 350 that receives an output signal sent by a sensor 300 as input. The interface circuit 200 also comprises a reference oscillator 202 that outputs a periodic synchronisation signal with frequency $f_{synchro}$. The synchronisation signal is sent on a second input of the oscillator 100.

The synchronisation signal is also sent on a first input of a measurement device 400 that also receives the output signal outputted by the oscillator 100 on a second input. The measurement device 400 detects the phase shift between the signals sent on its first and second inputs, this phase shift being representative of the data signal sent by the sensor 300. For example, the measurement device 400 may comprise a PLL to supply a frequency that is an integer multiple of the synchronisation frequency and a counter. The count frequency is the frequency of the signal output from the PLL. The count is made between the rising front of the synchronisation signal and the rising front of the signal output from the injection-locked oscillator.

The invention claimed is:
1. An injection-locked oscillator comprising at least:
one or several control inputs configured to receive one or several control signals, the oscillator being configured such that the value of its natural frequency depends on the amplitude of the control signal(s);
a synchronisation input configured to receive a periodic synchronisation signal, the oscillator being configured to output an output signal with a frequency equal to the frequency of the synchronisation signal when the oscillator is locked to the frequency of the synchronisation signal, and such that a phase shift between the output signal and the synchronisation signal depends on a difference between the natural frequency of the oscillator and the frequency of the synchronisation signal;
a first load impedance, the oscillator being configured such that a load signal is applied on the first load impedance;
a second load impedance;
a first coupling component configured to periodically couple the second load impedance to the first load impedance, at the frequency of the synchronisation signal, in parallel or in series,
wherein each of the first and second load impedance comprises at least one of: a capacitor, a capacitive component, a coil, and an inductive component.

2. The injection-locked oscillator according to claim 1, wherein the oscillator is a relaxation oscillator.

3. The injection-locked oscillator according to claim 1, wherein the first coupling component comprises at least one first coupling transistor coupled in series or in parallel to the second load impedance.

4. The injection-locked oscillator according to claim 1, also comprising at least:
a third load impedance, the oscillator being configured such that the load signal is applied on the third load impedance;

a fourth load impedance;
a second coupling component configured to periodically couple the fourth load impedance to the third load impedance, at the frequency of the synchronisation signal, in parallel or in series.

5. The injection-locked oscillator according to claim 4, also comprising at least:
a flip-flop, of which a clock input is coupled to the first and second load impedances, including a reset input coupled to the third and fourth load impedances, and an output configured to output the oscillator output signal, or
a lock, of which an input setting the lock into the low state is coupled to the first and second load impedances, of which an input setting the lock into a high state is coupled to the third and fourth load impedances, and of which an output is configured to output the oscillator output signal.

6. The injection-locked oscillator according to claim 5, wherein the first coupling component comprises at least one first coupling transistor coupled in series or in parallel to the second load impedance, and wherein a gate of the first coupling transistor is coupled to an output of a first NOR logic gate, a first input of which is coupled to the output of the flip-flop or the lock and a second input of which is configured to receive the synchronisation signal.

7. The injection-locked oscillator according to claim 4, wherein the second coupling component comprises at least one second coupling transistor coupled in series or in parallel to the fourth load impedance.

8. The injection-locked oscillator according to claim 5, wherein the second coupling component comprises at least one second coupling transistor coupled in series or in parallel to the fourth load impedance, and wherein a gate of the second coupling transistor is coupled to an output of a second NOR logic gate, a first input of which is coupled to an inverted output of the flip-flop or the lock and a second input of which is configured to receive an inverted signal of the synchronisation signal.

9. The injection-locked oscillator according to claim 5, wherein the oscillator comprises the flip-flop or the lock and:
a first discharge transistor coupled in parallel to the first and second load impedances, the gate of which is coupled to the output of the flip-flop or the lock;
a second discharge transistor coupled in parallel to the third and fourth load impedances, the gate of which is coupled to an inverted output of the flip-flop or the lock.

10. The injection-locked oscillator according to claim 5, wherein the oscillator comprises the flip-flop or the lock and:
a first input transistor, a gate of which is coupled to the output of the flip-flop or the lock and configured such that the load signal, corresponding to a load current, is or is not applied on the first load impedance as a function of the conducting or blocked state of the first input transistor;
a second input transistor, a gate of which is coupled to an inverted output of the flip-flop or the lock and configured such that the load signal is or is not applied on the third load impedance as a function of the conducting or blocked state of the second input transistor.

11. The injection-locked oscillator according to claim 1, wherein the control input or a first of the control inputs is coupled to the first load impedance such that the control signal or a first of the control signals forms the load signal.

12. The injection-locked oscillator according to claim 1, wherein:
the first load impedance comprises at least one first capacitor and, when the oscillator comprises a third load impedance, the third load impedance comprises at least one second capacitor, or
the first load impedance comprises at least one first capacitive transducer forming the control input or a second of the control inputs, the value of the natural frequency of the oscillator being a function of the value of the capacitance of the first capacitive transducer, and when the oscillator comprises the third load impedance, the third load impedance comprises at least one second capacitive transducer forming the control input or the second of the control inputs, the value of the natural frequency of the oscillator being a function of the value of the capacitance of the second capacitive transducer.

13. The injection-locked oscillator according to claim 5, wherein the oscillator comprises the flip-flop or the lock, and each of the load impedances is coupled to the flip-flop or the lock by means of at least one inverter, of which a threshold voltage control input forms the control input, or a third of the control inputs.

14. The injection-locked oscillator according to claim 1, wherein the oscillator is a harmonic oscillator comprising at least one LC circuit.

15. Oscillator according to claim 1, wherein the oscillator is a ring oscillator comprising at least an odd number of inverters greater than or equal to three, and such that an output of one of the inverters is coupled to the first load impedance.

16. The injection-locked oscillator according to claim 15, wherein an output of each of the inverters is coupled to a load impedance and to a coupling component configured to periodically couple another load impedance to said load impedance, at the frequency of the synchronisation signal and in parallel or series.

17. An interface circuit for a sensor, comprising at least one injection-locked oscillator according to claim 1, and a second oscillator of which an output is coupled to the synchronization input of the injection-locked oscillator.

* * * * *